United States Patent [19]
Kawai

[11] Patent Number: 6,066,970
[45] Date of Patent: May 23, 2000

[54] CIRCUIT FOR PRODUCING CLOCK PULSES FROM AN INPUTTED BASE BAND SIGNAL

[75] Inventor: Kazuo Kawai, Tokyo, Japan

[73] Assignee: General Research of Electronics, Inc., Tokyo, Japan

[21] Appl. No.: 09/052,618

[22] Filed: Mar. 31, 1998

[30] Foreign Application Priority Data

Jan. 12, 1998 [JP] Japan .................................. 10-016357

[51] Int. Cl.[7] .................................................. H03K 5/01
[52] U.S. Cl. ........................... 327/165; 327/166; 327/191
[58] Field of Search .................................. 327/165, 166, 327/291, 94

[56] References Cited

U.S. PATENT DOCUMENTS

| | | | |
|---|---|---|---|
| 4,160,951 | 7/1979 | Thyselius | 327/166 |
| 5,510,743 | 4/1996 | Shi | 327/165 |
| 5,546,032 | 8/1996 | Yatagai | 327/165 |

FOREIGN PATENT DOCUMENTS

| | | | |
|---|---|---|---|
| 2-207631 | 8/1990 | Japan | 327/165 |
| 4-49717 | 2/1992 | Japan | 327/165 |

*Primary Examiner*—Kenneth B. Wells
*Attorney, Agent, or Firm*—Trexler, Bushnell, Giangiorgi & Blackstone, Ltd.

[57] ABSTRACT

In order to reproduce a clock having little jitter in the clock reproduction in data transmission, a reproduced clock is outputted by sampling an inputted base band signal by using sampling pulses by means of a sampler and shaped by means of a flip-flop. Errors of the sampling timing are detected by sampling the base band signal two times with a predetermined interval for each bit and by comparing magnitude of fluctuations of preceding sampled values with magnitude of fluctuations of succeeding sampled values. A clock reproduced circuit acts as a phase synchronizing loop circuit during bit synchronizing signal periods, while during data signal periods errors of the sampling timing are corrected by using an output of the error detection.

1 Claim, 2 Drawing Sheets

CIRCUIT FOR PRODUCING CLOCK PULSES FROM AN INPUTTED BASE BAND SIGNAL

FIELD OF THE INVENTION

The present invention relates to circuit constructing techniques for a clock reproducing (called also timing reproducing) circuit, which in transmission of digital signals such as transmission by means of a modem or a wireless machine, transmission of a base band as it is as an LAN (Local Area Network), etc., extracts and reproduces a clock signal representing timing of each bit from a received signal shaped in the waveform by means of a roll off filter, etc.

DESCRIPTION OF THE PRIOR ART

As a prior art method for reproducing a clock signal from a base band signal, a method is widely utilized, wherein a clock component is extracted therefrom through a band pass filter (BPF) after having squared the base band signal. As modifications thereof, a method is utilized, in which a DPLL (Digital Phase Locked Loop) is used in lieu of the BPF or zero cross timing of the base band signal is used in lieu of squaring the base band signal.

From the squared signal or the zero cross timing of the base band signal, in case where information "1" and "0" repeat alternately and regularly as in a bit synchronizing signal, since a signal having a pure spectrum, whose frequency is equal to a bit speed, can be obtained, a pure clock having no jitter can be reproduced. On the contrary, in case of a usual data signal, where "1" and "0" are produced at random, since no signal having a pure spectrum can be obtained, remarkable jitter is produced.

However, since no jitter is produced at the zero cross timing in the case of square cosines type and roll off 100%, even in a data signal region, a pure clock can be reproduced. But, since this roll off 100% requires a wide transmission band, in many cases the roll off is used usually below 50%. Consequently, for this reason, timing jitter is produced in the reproduced clock in the data signal region.

In order to suppress this jitter, it is necessary to average the signal in to time and therefor to have a great Q for a BPF and to increase the number of frequency dividing steps for a DPLL so that it is not possible to respond quickly. However, since the fact that it is not possible to respond quickly means that it takes much time to follow the signal at an initial operation, either one should be selected whether it is possible to respond quickly or jitter is tolerated to a certain extent.

In the reproduction of data, as clearly seen from FIG. 1A indicating a relation between an eye pattern (called also eye diagram) and a sampling pulse, if even timing $P_2$ of the clock indicated in FIG. 1B is exact, data information can be taken out by effecting sampling at points of time, where there is no interference between codes secured by the Nyquist Standard (the eye is opened most widely). On the contrary, in the reproduction of the clock, since the Nyquist Standard is not utilized, the jitter described previously is produced. The part hatched by oblique lines in FIG. 1A indicates a region of trajectories differing depending on the pattern of the data sequence.

Although it would be good if it were possible to utilize the Nyquist Standard also for the reproduction of the clock, information at sampling points is data information itself and information on the timing of the clock is not included therein. Consequently it is not possible to reproduce the clock only from the information at sampling points. However, seeing the eye pattern indicated in FIG. 1A, correct timing, which the clock should have, can be recognized.

SUMMARY OF THE INVENTION

This means that there is some method, in which the clock can be reproduced, starting from the waveform before and after the sampling points. Therefore, an object of the present invention is to find means for reproducing the clock, starting from the waveform before and after the sampling points.

In order to achieve the above object, a circuit for reproducing a clock by sampling an inputted base band signal by means of sampling pulses, according to the present invention, is characterized in that it comprises sampling means for sampling the inputted base band signal two times before and after each of the sampling pulses with a predetermined time interval for each bit; error detecting means for detecting errors in the timing of the sampling pulses by comparing magnitude of fluctuations of preceding sampled values with magnitude of fluctuations of succeeding sampled values; and timing correcting means for correcting errors in the timing of the sampling pulses by synchronizing the sampling pulses with a clock component during bit synchronizing signal periods of the inputted base band signal and by using an output of the error detecting means during data signal periods.

DESCRIPTION OF THE PREFERRED EMBODIMENTS

A data signal is transmitted in the form of packets. A bit synchronizing signal (alternate repetition of information "1" and "0" consisting of several tens of bits) is arranged at the heading thereof and the clock is reproduced from this bit synchronizing signal by means of sampling pulses $P_2$ synchronized with a clock component. At this point of time, as described previously, a pure clock is reproduced also by means of a conventional circuit. However, in the conventional circuit, since the clock reproduction is continued with the circuit construction as it is even in the data signal period the jitter is produced. Therefore, according to the present invention, timing errors of the sampling pulses $P_2$ are detected as soon as data signal periods appear and corrected in a manner explained below.

Figure 1A:
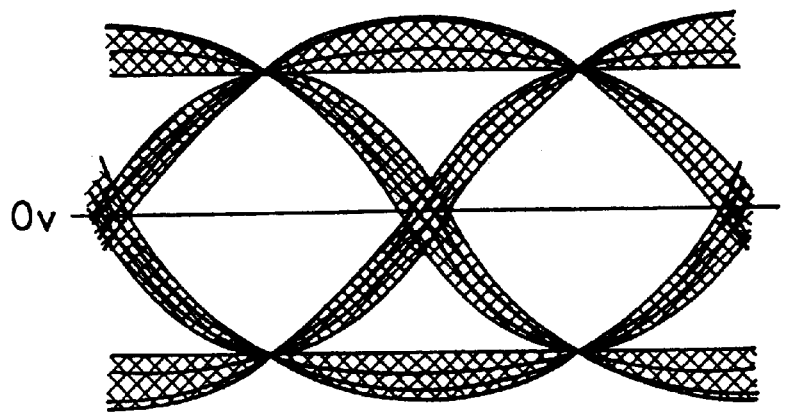
FIG. 1 is a diagram indicating waveforms for explaining the operation of the present invention.
Figure 1B:
Figure 2A:
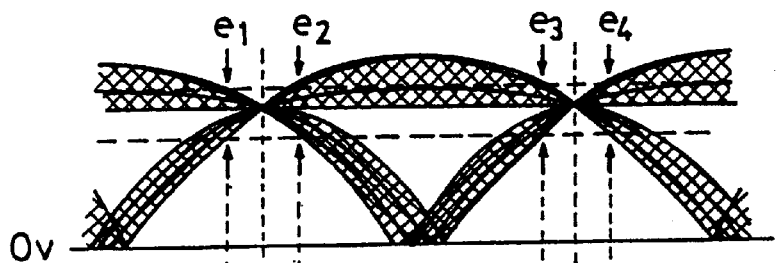
FIG. 2 is another diagram indicating waveforms for explaining the operation of the present invention.
Figure 2B:
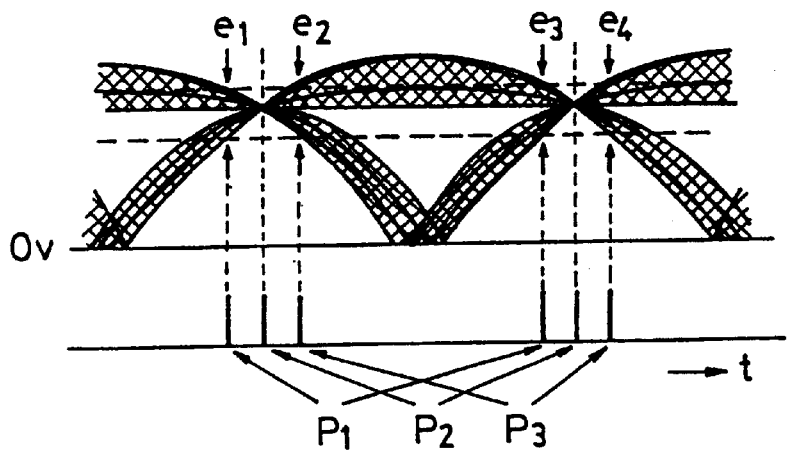

That is, at first an absolute value of the base band signal is obtained. In this way, an eye pattern as indicated in FIG. 2A (called eye pattern for the sake of explanation of the waveform, although eyes exist no more) is obtained. Then this is sampled. The sampling is effected two times before and after a sampling pulse $P_2$ for each bit of information (in the order of time $P_1$ is called a first sampling pulse, $P_2$ a second sampling pulse, and $P_3$ a third sampling pulse). That is, the second sampling pulse $P_2$ is at the center of the sampling pulses and $P_1$ precedes it by $\Delta T$, while $P_3$ succeeds it by $\Delta T$.

Since the clock reproducing circuit is designed so as to generate a correct timing clock during bit synchronizing signal periods, which proceed to data signal periods while maintaining that timing, a pulse $P_2$ is produced at a point of time, where the eye is opened most widely. Consequently, there are almost no fluctuations of a second sampled value obtained by using the second sampling pulse $P_2$. Also, the magnitude of fluctuations of a first sampled value obtained by using the first sampling pulse $P_1$ is approximately in a same level as magnitude of fluctuations of a third sampled value obtained by using the third sampling pulse $P_3$. The magnitude of fluctuations of these sampled values is indicated by thick arrows $e_1$ to $e_4$ in FIG. 2A. When the clock is deviated from this timing in the forward direction, fluctuations of the first sampled values are greater than fluctuations of the third sampled values and on the contrary, when it is deviated therefrom in the backward direction, fluctuations of the third sampled values are greater than fluctuations of the first sampled values. Consequently, since the direction of errors of the reproduced clock can be known by comparing the magnitude of fluctuations of the first sampled values with the magnitude of fluctuations of the third sampled values, the phase of the reproduced clock may be controlled to be corrected, referring to this comparison output.

Figure 3:
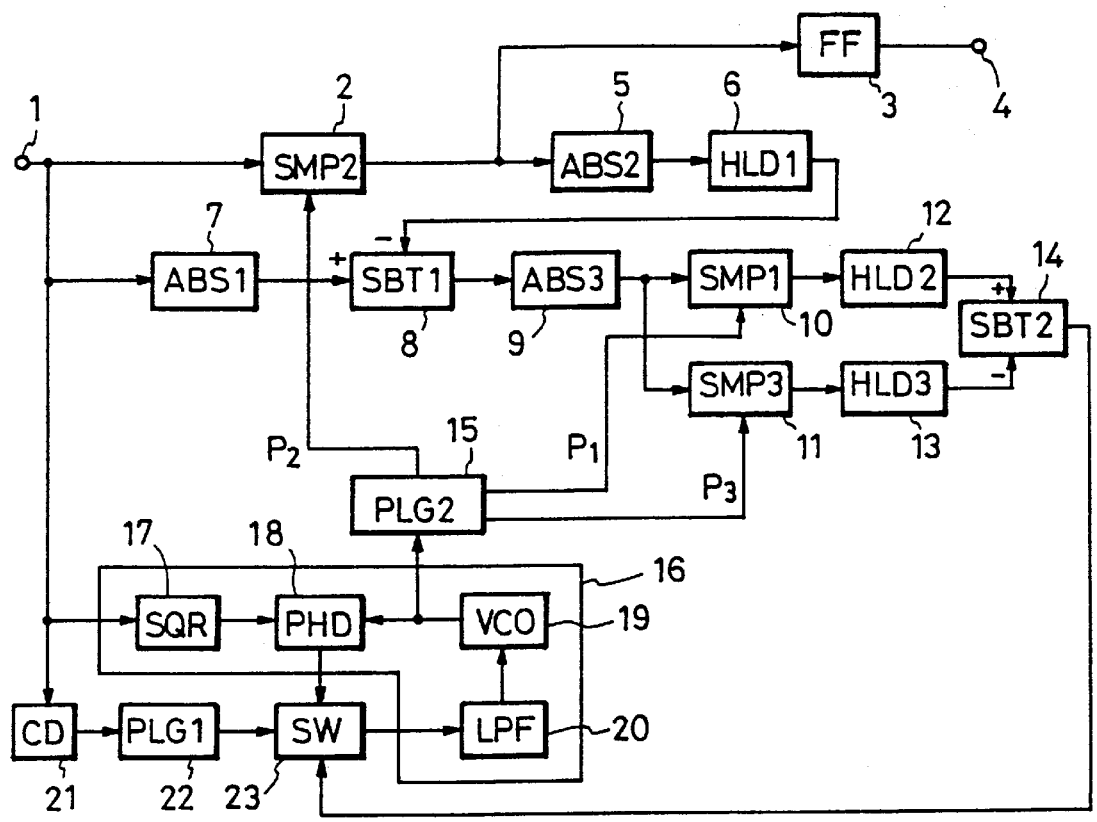
FIG. 3 is a circuit construction diagram for explaining the operation of the present invention.

Hereinbelow an embodiment of the present invention will be explained. FIG. 3 is a circuit construction diagram indicating an embodiment of the clock reproducing circuit according to the present invention.

In FIG. 3, reference numeral 1 is a base band signal input terminal; 2 is a flip-flop circuit acting as a sampler SMP2; 3 is another flip-flop circuit acting as a waveform shaping circuit FF; 4 is a waveform shaped signal (clock) output terminal; 5 is an absolute value forming circuit ABS2; 6 is a holding circuit HLD1; 7 is another absolute value forming circuit ABS1; 8 is a subtracter SBT1; 9 is still another absolute value forming circuit ABS3; 10 is a sampler SMP1; 11 is another sampler SMP3; 12 is another holding circuit HLD2; 13 is still another holding circuit HLD3; 14 is another subtracter SBT2; 15 is a pulse generator PLG2; 16 is a sampling pulse phase control circuit for clock reproducing; 17 is a squaring circuit SQR; 18 is a phase detector PHD; 19 is a voltage controlled oscillator VCO, 20 is a low pass filter LPF; 21 is a carrier detector CD; 22 is another pulse generator PGL1; and 23 is a switching circuit SW.

The sampling pulse phase control circuit for clock reproduction 16 is closed of the squaring circuit 17, the phase detector 18, the voltage controlled oscillator 19 and the low pass filter 20. When the switching circuit is switched so that the phase detector 18 is connected with the low pass filter 20, the circuit 16 acts as a phase synchronizing loop circuit, while when it is switched so that the subtracter 14 is connected with the low pass filter 20, the circuit 16 acts as a timing correcting circuit for the second sampling pulse $P_2$, using an error signal detected from the eye pattern described previously.

The switching circuit 23 is controlled by the carrier detector 21 and the pulse generator 22. When the carrier detector 21 detects entrance of a base band signal, the pulse generator 22 is driven by a detection output thereof and switching-over of the switching circuit 23 is controlled by an output pulse of the latter. This switching-over is effected so that the circuit 16 acts as the phase synchronizing loop circuit during bit synchronizing signal periods of the input base band signal, while it acts as the timing correcting circuit during data signal periods.

Now, when a base band signal is inputted to the signal input terminal 1, it is given to the sampler 2, the squaring circuit 17 and the carrier detector 21 and the sampler 2 samples the inputted base band signal by using the sampling pulse $P_2$ to extract the data signal. This signal is applied to the flip-flop circuit 3 to be shaped into a rectangular wave and outputted to the shaped signal output terminal 4.

At this time, during bit synchronizing signal periods, since the circuit 16 acts as the phase synchronizing loop circuit as described previously, the sampling pulse $P_2$ is synchronized with the clock component of the inputted base band signal and in the same manner by the prior art techniques it is possible to obtain a clock reproduction signal at the output terminal 4.

However, errors would be produced in the timing of the second sampling pulse, if the state of the circuit were held as it was, during data signal periods.

The inputted base band signal is converted into a signal having the eye pattern indicated in FIG. 2A and this signal is inputted to the subtracter 8 on the (+) side.

Figure 4A:
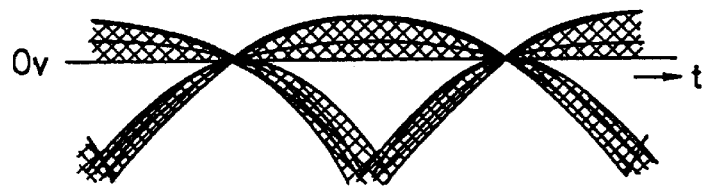
FIG. 4 is a still another diagram indicating waveforms for explaining the operation of the present invention.
Figure 4B:
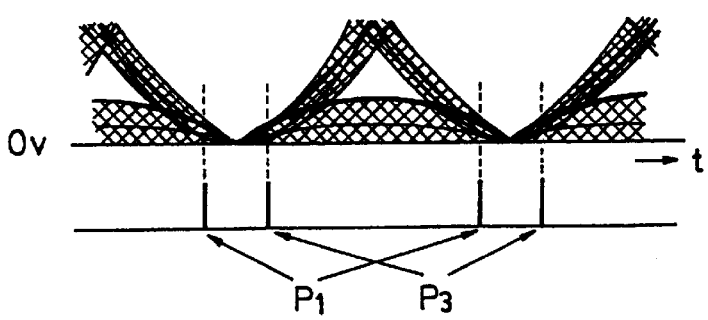

On the other hand, an output of the sampler 2 is applied to the absolute value forming circuit 5 to be converted into pulses representing amplitudes of data points of the data signal, which are converted into a DC voltage signal by the holding circuit 6. The DC voltage signal is inputted to the subtracter 8 on the (−) side. The subtracter 8 subtracts a value representing amplitudes of the data signal from the eye pattern signal which is the output of the absolute value forming circuit 7 to convert the latter into a signal, whose reference is 0V, as indicated in FIG. 4A. This signal is full-wave-rectified in the absolute value forming circuit 9 so that a signal having a waveform as indicated in FIG. 4B is obtained.

This signal is applied further to the sampler 10 and the sampler 11 to be sampled by the sampling pulses $P_1$ and $P_3$, respectively. An output of the sampler 10 is applied to the holding circuit 12, while an output of the sampler 11 is applied to the holding circuit 13, to be converted into DC voltage signals, respectively. If discharging time constants of these two holding circuits are sufficiently great, it is possible to obtain DC voltage signals equal to quasi-peak values of the outputs of the samplers 10 and 11.

Since outputs of the holding circuits 12 and 13 are DC voltages equal to quasi-peak values of fluctuations of the first and the third sampled values, respectively, in case where the second sampling pulse $P_2$ is in accordance with the point of time where the eye is opened most widely, the outputs of the two holding circuits are equal to each other. On the other hand, when the sampling pulses are advanced with respect thereto, the output of the holding circuit 12 is greater, while the output of the holding circuit 13 is greater when they are retarded. Consequently it is possible to detect the direction of timing errors by comparing the outputs of the two holding circuits by the subtraction by means of the subtracter 14.

At this point of time, since the switching circuit 23 has been already turned to the side of the subtracter 14, the error voltage outputted by the subtracter 14 is applied to the voltage controlled oscillator 19 through the low pass filter 20 so that the timing errors of the second sampling pulse $P_2$ is corrected.

As explained in detail above, according to the present invention, for the timing correction of the second sampling pulse $P_2$ during data signal periods, a method is used in which magnitudes of fluctuations of sampled values sampled at two timings deviated before and after by a predetermined interval from a correct sampling point are compared with each other for correcting timing of the second sampling point $P_2$ during data signal periods. Since fluctuating values are compared to each other, at first sight it seems that results obtained by the comparison fluctuate, too. However, since the fluctuations of the sampled values vary, depending on contents of a data sequence, there exist an upper and a lower limit. Consequently peak values thereof are almost restricted so that control using the results obtained by the comparison can be effected stably.

Further, as clearly seen from the above explanation, the circuits 2, 3, 15 and 16 are conventional clock reproducing circuits. The circuits 5, 6, 7, 8, 9, 10, 11 and 17 constitute sampling means; the circuits 12 to 14 error detecting means; and the circuits 21 to 23 timing correcting means. However it is a matter of course that the present invention is not restricted to such a circuit construction.

As described in detail above, according to the present invention, in the clock reproduction from the base band data signal, since zero cross parts of the signal are not used, it is possible to reproduce a clock having little jitter also during data signal periods.

In the claims:

1. A circuit including first sampling pulse generating means for producing a clock by sampling an inputted base band signal by means of first sampling pulses, comprising:

sampling means for sampling said inputted base band signal two times by second sampling pulses before each of said first sampling pulses and by third sampling pulses after each of said first sampling pulses with a predetermined time interval;

error detecting means for detecting errors in the timing of said sampling pulses by comparing magnitude of fluctuations values sampled by the second sampling pulses with magnitude of fluctuations of values sampled by the third sampling pulses; and timing correcting means for correcting errors in the timing of said first sampling pulses by using an output of said error detecting means during data signal periods in the inputted base band signal.

* * * * *